(12) United States Patent
Val et al.

(10) Patent No.: US 12,225,662 B2
(45) Date of Patent: Feb. 11, 2025

(54) MOTOR VEHICLE LIGHTING MODULE COMPRISING A CERAMIC SUBSTRATE

(71) Applicant: VALEO VISION, Bobigny (FR)

(72) Inventors: Alexandre Val, Bobigny (FR); Samuel Daroussin, Bobigny (FR); Zdravko Zojceski, Bobigny (FR); Antoine De Lamberterie, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 18/246,953

(22) PCT Filed: Sep. 30, 2021

(86) PCT No.: PCT/EP2021/077023
§ 371 (c)(1),
(2) Date: Mar. 28, 2023

(87) PCT Pub. No.: WO2022/069673
PCT Pub. Date: Apr. 7, 2022

(65) Prior Publication Data
US 2023/0363088 A1 Nov. 9, 2023

(30) Foreign Application Priority Data

Sep. 30, 2020 (FR) ...................................... 2010015

(51) Int. Cl.
*H05K 1/03* (2006.01)
*F21S 43/14* (2018.01)
(Continued)

(52) U.S. Cl.
CPC ............ *H05K 1/0306* (2013.01); *F21S 43/14* (2018.01); *F21V 19/001* (2013.01); *F21V 23/06* (2013.01);
(Continued)

(58) Field of Classification Search
CPC ........ F21S 43/14; F21V 19/001; F21V 23/06; H05K 2201/10106; H05K 1/0306; H05K 2201/09018; H05K 1/0206; H05K 1/147
See application file for complete search history.

(56) References Cited

U.S. PATENT DOCUMENTS

2004/0222433 A1* 11/2004 Mazzochette ....... H01L 25/0753
257/E33.059
2008/0291631 A1 11/2008 Hellinger et al.
(Continued)

FOREIGN PATENT DOCUMENTS

| EP | 1 995 514 A2 | 11/2008 |
| EP | 2 031 299 A1 | 3/2009 |
| KR | 20140029181 A * | 3/2014 |

OTHER PUBLICATIONS

Search English translation of KR 20140029181 A (Year: 2014).*
International Search Report mailed on Dec. 23, 2021 in PCT/EP2021/077023 filed on Sep. 30, 2021 (2 pages).

*Primary Examiner* — Omar Rojas Cadima
(74) *Attorney, Agent, or Firm* — Oblon, McClelland, Maier & Neustadt, L.L.P.

(57) ABSTRACT

A lighting module of a motor vehicle signaling device includes a ceramic substrate having opposite first and second faces, and a plurality of selectively activatable light sources mounted on the first face of the ceramic substrate. Each of the first and second faces of the ceramic substrate are provided with at least a first and a second respective interconnection layer. The ceramic substrate comprises a plurality of through holes designed to interconnect the first interconnection layer to the second interconnection layer.

19 Claims, 2 Drawing Sheets

Figure 1:
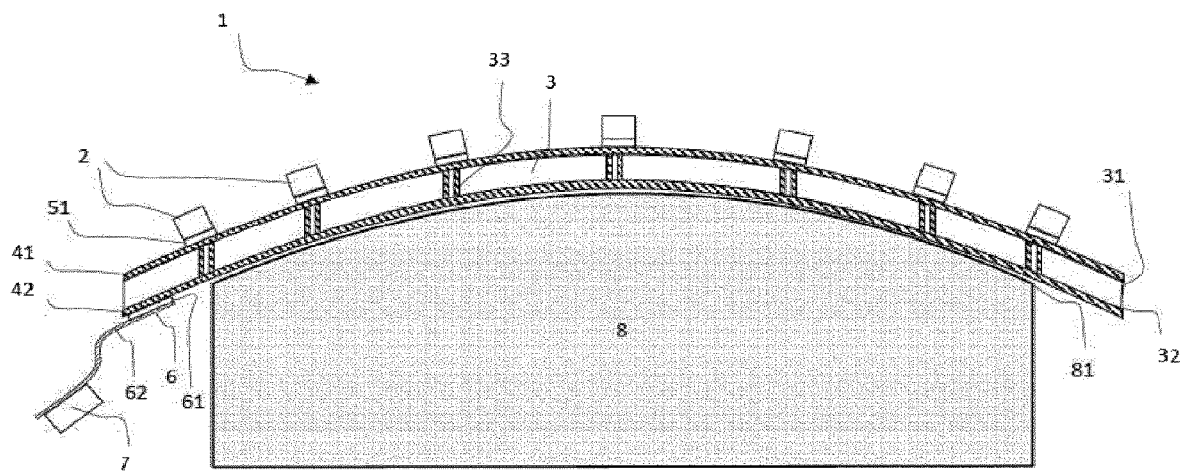

(51) Int. Cl.
*F21V 19/00* (2006.01)
*F21V 23/06* (2006.01)
*H05K 1/02* (2006.01)
*H05K 1/14* (2006.01)

(52) U.S. Cl.
CPC ........... *H05K 1/0206* (2013.01); *H05K 1/147* (2013.01); *H05K 2201/09018* (2013.01); *H05K 2201/10106* (2013.01)

(56) References Cited

U.S. PATENT DOCUMENTS

| | | |
|---|---|---|
| 2009/0091020 A1 | 4/2009 | Wei et al. |
| 2009/0266599 A1 | 10/2009 | Kan et al. |
| 2010/0103138 A1 | 4/2010 | Huang et al. |
| 2011/0260200 A1 | 10/2011 | Chen |
| 2013/0075146 A1 | 3/2013 | Fushie et al. |
| 2014/0022784 A1* | 1/2014 | Dohn ................. F21K 9/64 362/235 |
| 2016/0025281 A1* | 1/2016 | Gardner ............. B60K 35/00 362/520 |

\* cited by examiner

MOTOR VEHICLE LIGHTING MODULE COMPRISING A CERAMIC SUBSTRATE

The invention relates to the field of lighting and light-signaling for motor vehicles. More specifically, the invention relates to the field of screens integrated into motor vehicle lighting or light-signaling lighting modules.

It is known practice to integrate screens into motor vehicle lighting modules, for example into tail lights. These screens are for example produced by means of arrays of a large number of light sources that can be selectively activated, the dimensions of which are small enough for it to be possible to display information on these screens, for example in the form of messages or pictograms, with satisfactory resolution. Such information thus makes it possible to improve the signaling given by the motor vehicle, for example by contextualizing a given signaling function or displaying an accompanying message. For comfort and safety reasons, it is however necessary to integrate the screen into the lighting module in such a way that the visible appearance of the screen is uniform, and in such a way that the screen and the information displayed thereon are visible in a wide field of view.

In addition, motor vehicle esthetics impose certain constraints regarding the integration of the screen. Specifically, in order to fit in with the modern esthetic of motor vehicles, motor vehicle tail lights and headlamps nowadays have an outer lens that is highly curved, and this has a strong impact on the shape of the internal components.

In order to meet these various constraints, there has been the idea of curving the screen to give it a convex shape so as to follow the curvature of the outer lens and obtain a surface that is visible in a wide field of view, and with an appearance that is uniform. For all that, known screen technologies, for example LCD screen technologies, are unable to meet this need for curvature because of the substrates used for mounting and operating their light sources. In particular, these technologies are not suitable for small radii of curvature, because the protection of the various intermediate layers of these substrates, which is normally afforded by the outer layers, is no longer optimal. Conversely, OLED screen technologies do make it possible to obtain curved screens, but do not offer the durability required for the automotive field. As a result, the screens may suffer from corrosion due to the internal environment of the tail light or of the headlamp, for example as a result of moisture, temperature, or sulfur or chlorine derivatives, which may propagate in the interfaces between these intermediate layers.

Finally, it is desirable to integrate this screen into a lighting module while giving it a floating appearance, which is to say an appearance whereby the edges have no visible means of electrical connection and/or of mechanical securing. Nevertheless, it is necessary to provide means allowing each of the light sources of this screen to be selectively controlled.

There is thus a need for a motor vehicle lighting module incorporating a screen that can be curved in order to give it a convex shape, and that has a floating appearance. The invention falls within this context and aims to meet this need.

To this end, the invention relates to a lighting module of a motor vehicle signaling device, comprising a ceramic substrate comprising opposing first and second faces, and a plurality of light sources that can be activated selectively, mounted on the first face of the ceramic substrate, each of the first and second faces of the ceramic substrate being provided with at least one first or second interconnection layer respectively, characterized in that the ceramic substrate comprises a plurality of through-holes arranged to interconnect the first interconnection layer and the second interconnection layer.

According to the invention, the use of a ceramic substrate makes it possible for the substrate to be sufficiently thin for it to be bent or curved, in particular in order to obtain a small radius of curvature. Using a ceramic also avoids the use of organic materials, so as to ensure the durability and resistance of the lighting module to the internal stresses of the signaling device. In addition, the use of through-holes or through-glass vias (TGVs), connecting an interconnection layer linked to the light sources on one side of the substrate to an interconnection layer situated on the other side of the substrate makes it possible to arrange the different electronic components necessary for controlling the plurality of light sources on this other side of the substrate, so that they are not visible and the substrate thus appears to be floating.

Ceramic substrate is given to mean a substrate made from a material having a crystalline or partially crystalline or amorphous structure, such as a glass or an alumina, made up of essentially inorganic substances, and which is formed by a molten mass that solidifies as it cools, or which is formed and matured, at the same time or subsequently, through the action of heat and/or pressure. Advantageously, the ceramic substrate is a glass substrate. Advantageously, the ceramic substrate is an alumina substrate (Al2O3) or else an aluminum nitride (AlN) substrate. It will be noted that the glass substrate (borosilicate glass) is commonly used due to its dielectric properties and production cost.

Advantageously, each of the light sources comprises at least one light-emitting semiconductor chip with dimensions of between 80 μm and 300 μm. Such a chip is in particular known as a mini-LED. As a variant, each of the light sources comprises at least one light-emitting semiconductor chip with dimensions of between 5 μm and 80 μm. Such a chip is in particular known as a micro-LED. If so, the light sources may be mounted directly or indirectly on the first face of the ceramic substrate, in particular so that two adjacent light sources are a maximum of 1 mm apart. If desired, the first and/or the second interconnection layer may comprise a network of conductor tracks. If so, the network of conductor tracks of the first interconnection layer may be connected to each of the light sources. If desired, the thickness of the first interconnection layer may be substantially equal to the thickness of the second interconnection layer.

Advantageously, each of the through-holes is provided with internal plating made from an electrically conductive material connected to said first and second interconnection layers, or, as a variant, filled with an electrically conductive material connected to said first and second interconnection layers. For example, the electrically conductive material may be copper. In addition to providing an electrical connection, the use of copper makes it possible to propagate the heat emitted by the light sources on one side of the substrate to the other side of the substrate, for example to a heat sink. It will be noted that the through-holes make it possible to increase the thermal conductivity of the ceramic substrate, by forming thermal resistors mounted in parallel that advantageously modify the heat-conducting properties of the ceramic substrate.

Also advantageously, the ceramic substrate may be curved. For example, the ceramic substrate may have convex shape, from the viewpoint of an observer situated outside the motor vehicle. Preferably, the ceramic substrate may have a radius of curvature of between 90 mm and 500 mm and a thickness of between 50 µm and 500 µm, in particular between 100 µm and 200 µm.

According to one embodiment of the invention, each light source is mounted on said first face of the ceramic substrate level with a through-hole. As a variant, the plurality of light sources is split into a plurality of groups of light sources, in particular mounted in series, and each group of light sources is mounted on said first face of the substrate in association with a through-hole.

Advantageously, the module comprises a connector capable of receiving an instruction for controlling said light sources and a control unit arranged to selectively control each of the light sources on the basis of said control instruction received by the connector. For example, the light sources are arranged on the ceramic substrate in a matrix and the control unit is arranged to address and control each of the light sources according to its position in said matrix. For example, on receipt of a control instruction, the control unit may be arranged to scan the matrix vertically, successively selecting each row of the matrix, in particular by applying a selection voltage to each of the rows in succession and, for each row selected during the scan, to simultaneously apply, on the basis of the control instruction, an activation or deactivation signal to each column of the matrix so as to cause or prevent the emission of light by the light source addressed by the selected row and this column. The number of tracks in the connector, which are necessary to address each of the light sources, is thus equal to the sum of the columns and rows.

Preferably, the connector comprises an adhesive anisotropic conductive film, the connector being mechanically and electrically connected to one of the first and second interconnection layers by means of said adhesive anisotropic conductive film. The connector is thus an ACF (anisotropic conductive film) connector. For example, the connector may be mounted on the first face or on the second face of the ceramic substrate, in particular on an edge of said face.

Advantageously, the connector may comprise a flexible printed circuit board, the control unit being mounted directly on said flexible printed circuit board. This type of arrangement is also known as CoF, or Chip on Flex. As a variant, the control unit may be mounted on the first and/or second face of the ceramic substrate, in particular by means of an adhesive anisotropic conductive film or, as a variant, may be incorporated into a ball grid array (BGA). This type of arrangement is also known as CoG, or Chip on Glass. If desired, a plurality of control units and/or a plurality of connectors may be provided.

Advantageously, the connector may be mounted on the second face of the ceramic substrate. It will be appreciated that if the connector is mounted on the first face of the substrate, its height will exceed the height of the light sources, and this will impose constraints on the production of the lighting module. For this reason, it is advantageous for the connector to be mounted on the second face, so as not to interfere with the optical surface.

In one embodiment of the invention, the lighting module comprises a plurality of active control elements, each active control element being arranged to control one of the light sources with which it is associated and being mounted on the first interconnection layer level with one of the through-holes so as to be connected to the second interconnection layer, said plurality of active control elements forming an active matrix and the control unit being arranged to control said active matrix on the basis of said control instruction received by the connector.

In other words, the control unit is capable of controlling each light source by addressing and controlling the associated control element. What is notably meant by an active control element is the fact that each control element is designed to actively maintain the associated light source in the illuminated or switched-off state while the active matrix is being scanned by the control unit.

Advantageously, each of the light sources comprises at least one OLED light-emitting part. In this case, the lighting module preferably comprises active control elements associated with the light sources, thus forming an active matrix so as to create an AMOLED display Advantageously, each light source is mounted on and connected to the control element with which it is associated. For example, each control element comprises a thin film transistor, also known as a TFT, on which the associated light source is mounted and to which same is connected. If so, all of the plurality of light sources and the plurality of active control elements form an active matrix.

As a variant, the first interconnection layer may comprise one or more thin connection sub-layers, in particular less than 50 µm thick, incorporating a plurality of active control elements, each active control element being arranged to control one of the light sources with which it is associated, and each light source is mounted on and connected directly to said first interconnection layer, substantially in line with a control element of the thin connection layer or layers, to which it is connected. Each active control element may for example be of the integrated microcircuit type, comprising at least one transistor and one memory. If so, all of the plurality of light sources and the thin connection sub-layer or sub-layers incorporating the plurality of active control elements form an active matrix.

As a further variant, the lighting module comprises a plurality of active control elements, each active control element being arranged to control one or a plurality of the light sources with which it is associated and being mounted directly on the first interconnection layer, and each light source is mounted on and connected directly to said first interconnection layer while being connected to the associated active control element. Advantageously, the first interconnection layer may comprise one or more sub-layers. Each active control element may for example be of the integrated microcircuit type, comprising at least one transistor and one memory. If so, all of the plurality of light sources and the plurality of active control elements form an active matrix.

In another embodiment of the invention, each light source is mounted directly on the first interconnection layer, the plurality of light sources forming a passive matrix and the control unit being arranged to control said passive matrix on the basis of the control instruction received by the connector. If so, the lighting module may comprise a plurality of devices for controlling the supply of electrical power to the light sources, the devices for controlling the supply of electrical power being mounted on the second face of the ceramic substrate. For example, each control device may be mounted on the second face of the ceramic substrate level with a through-hole, said control device being arranged to control the supply of electrical power to the light source mounted level with said through-hole.

Advantageously, the lighting module comprises a support member on which the ceramic substrate is mounted. If so, the support member has a face for receiving the ceramic substrate, said face having a curved, in particular convex, profile. The support member thus makes it possible to secure and shape the ceramic substrate, while offering a solution for mounting the ceramic substrate in the lighting module that makes it possible to obtain a floating appearance. If desired, the support member may be arranged to dissipate the heat emitted by the light sources and/or the control unit. For example, the support member may be made from a thermally conductive material, in particular aluminum, and have a plurality of heat-dissipating fins. The support member thus performs several functions, in particular the functions of mechanical securing of the ceramic substrate against the vibrations to which the lighting module is subject, heat dissipation with respect to the thermal stresses linked to the confined environment of the lighting module, and compensation for the thermal expansion of the lighting module.

If desired, said face for receiving the ceramic substrate may be arranged to accommodate the different components mounted on the second face of the ceramic substrate. For example, said receiving face may comprise a plurality of recesses, in particular formed by machining the support member. In another example, the components are embedded in the recesses and covered with resin, and connected to the first interconnection layer. In this case, the heat dissipation and appearance of the module when off are improved.

Advantageously, the lighting module comprises an opaque coating applied to the first face of the ceramic substrate. For example, the opaque coating may be formed on the first interconnection layer and be provided with openings formed level with the light sources. If so, the opaque coating may be applied before the components are mounted on the first face of the ceramic substrate, in particular by using a mask. As variant, the opaque coating may be applied after said components have been mounted. Preferably, the opaque coating may be a dark color with a matt appearance. This coating makes it possible in particular to avoid the reflection of so-called stray light rays emitted by the light sources toward the ceramic substrate and thus improves the contrast, which is desirable when there is significant ambient brightness.

The invention also relates to a motor vehicle light signaling device comprising a lighting module according to the invention. If desired, the signaling device may be configured as a tail light of the motor vehicle.

Figure 2:
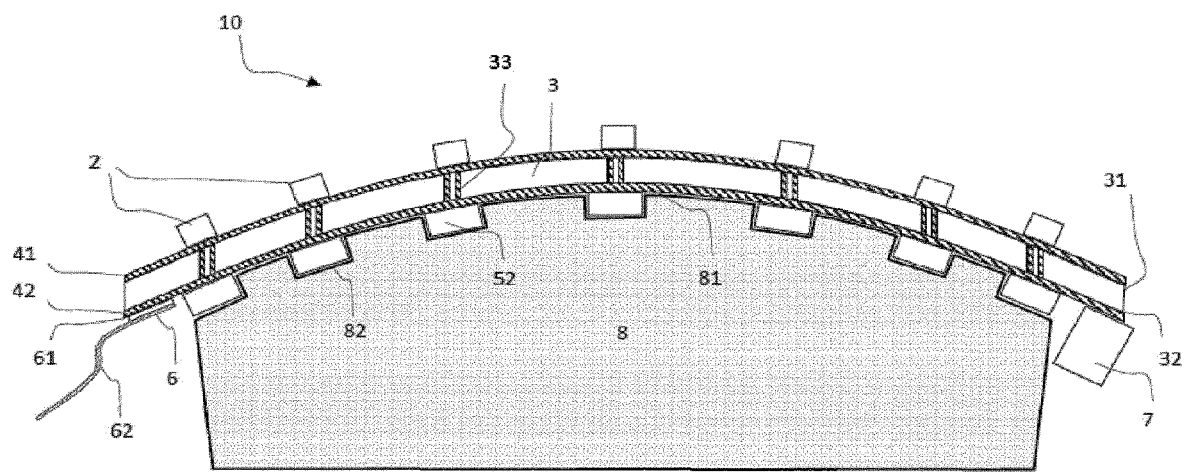
Figure 3:
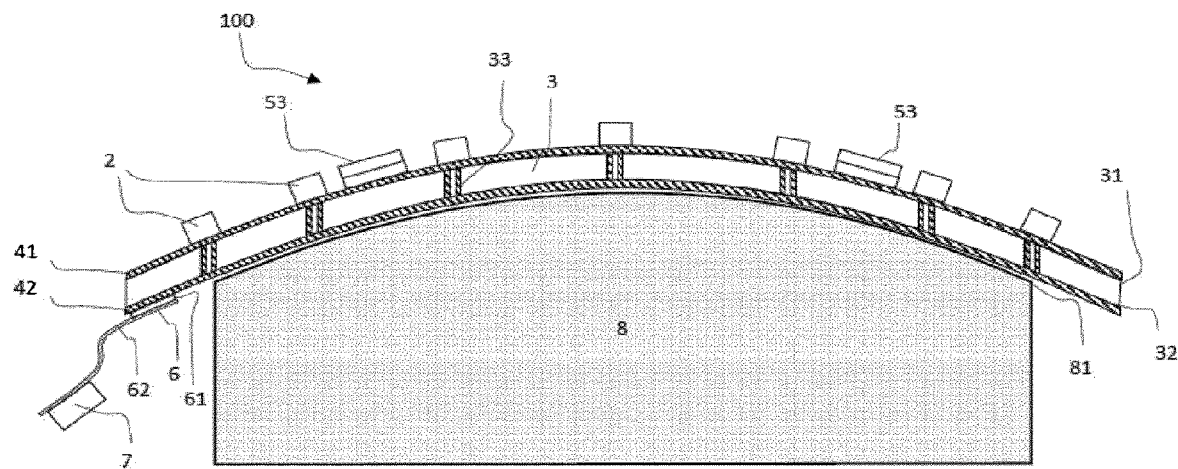
Figure 4:
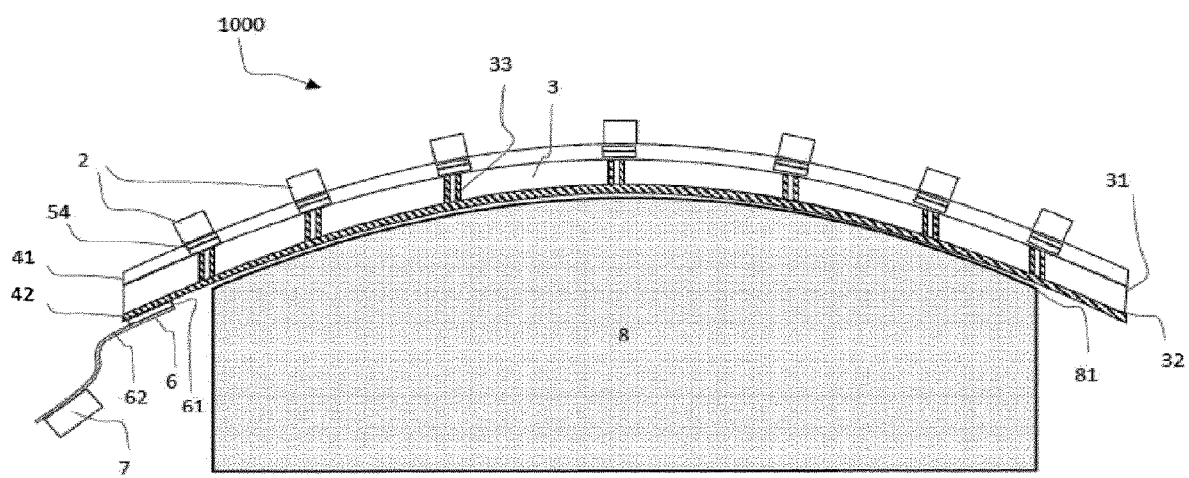

The present invention will now be described by way of examples that are merely illustrative and that in no way limit the scope of the invention, and with reference to the accompanying illustrations, in which:

FIG. 1 schematically and partially depicts a cross-sectional view of a lighting module according to a first embodiment of the invention;

FIG. 2 schematically and partially depicts a cross-sectional view of a lighting module according to a second embodiment of the invention;

FIG. 3 schematically and partially depicts a cross-sectional view of a lighting module according to a third embodiment of the invention; and FIG. 4 schematically and partially depicts a cross-sectional view of a lighting module according to a fourth embodiment of the invention.

In the following description, elements that are identical, in structure or function, and that appear in several figures, use the same reference signs, unless otherwise indicated.

FIG. 1 shows a first embodiment of a lighting module 1 according to the invention. This lighting module 1 forms part of a tail light of a motor vehicle.

The lighting module 1 comprises a plurality of light sources 2 mounted on a first face 31 of a glass substrate 3. Each of the light sources 2 comprises at least one light-emitting semiconductor chip with dimensions of between 5 µm and 80 µm. The light sources 2 are mounted on the first face 31 in a matrix such that two adjacent light sources 2 are a maximum of 1 mm apart.

In order to control these light sources 2 selectively, the first face 31 of the glass substrate is provided with a first interconnection layer 41, comprising a network of copper electrical tracks electrically connected to the light sources 2. Symmetrically, the second face 32 of the glass substrate 3, opposite the first face 31, is likewise provided with a second interconnection layer 42, comprising a network of copper electrical tracks of a thickness substantially identical to that of the first layer 41. The glass substrate 3 comprises a plurality of through-holes 33, each of the through-holes being provided with an internal copper coating making it possible to interconnect said first and second interconnection layers 41 and 42.

In the example described, it will be noted that each light source 2 is mounted on the first interconnection layer 41 by means of a thin film transistor 51, on which said light source 2 is mounted and to which same is connected. Each thin film transistor 51 is mounted on and electrically connected to the first interconnection layer 41 level with a through-hole 33 so as to be connected to the second interconnection layer 42. These thin film transistors 51 thus form an active matrix making it possible to address and control each of the light sources 2, all of the light sources 2 thus forming an active matrix screen.

In order to control this active matrix, the lighting module 1 comprises a connector 6 for receiving an instruction for controlling the light sources 2. This may for example be an instruction to display a pictogram or a message on said screen, in particular generated by a computer of the motor vehicle, for example on the basis of data relating to the environment of the motor vehicle. By way of example, this may be an instruction to display a pictogram informing an external observer of the opening of a door of the motor vehicle, a pictogram informing a motorist following the motor vehicle of the presence of ice on the road, or information relating to the traffic.

In order to be mechanically connected to the glass substrate 3 and electrically connected to the second interconnection layer 42, the connector 6 comprises an adhesive anisotropic conductive film 61 fixed to a flexible printed circuit board 62. The film 61 thus allows the board 62 to be fixed on an edge of the second face 32 of the glass substrate 3 while electrically connecting this board to the second interconnection layer 42.

The lighting module 1 further comprises a control unit 7 arranged to selectively control the active matrix on the basis of the control instructions received by the connector 6. In the example described, the control unit 7 is mounted directly on the flexible printed circuit board 62.

Non-limitingly, on receipt of a control instruction, the control unit 7 may be arranged to scan the matrix of transistors 51 vertically, applying a selection voltage to each of the rows in succession and, for each row selected during the scan, to simultaneously apply, on the basis of the control instruction, an activation or deactivation signal to each column of the matrix so as to cause or prevent the emission of light by the light source 2 associated with the transistor 51 addressed by the selected row and this column. As the matrix is active, each transistor 51 maintains the light source 2 associated therewith in an on or off state while the remaining rows are scanned.

It will be observed from FIG. 1 that the glass substrate 3 has a convex curved shape, from the viewpoint of an observer situated outside the motor vehicle. In order to be able to shape this glass substrate 3 into this convex curved shape, the substrate 3 has a thickness of between 100 µm and 200 µm, making it flexible and thus allowing it to be given a curvature with a radius of curvature of between 90 mm and 500 mm, without the risk of weakening the various components mounted on this substrate 3, particularly on the second face 32

In addition, in order to be able to maintain this convex curved shape, the lighting module 1 comprises a support member 8 on which the glass substrate 3 is mounted. The support member has a face 81 for receiving the glass substrate 3 having a convex curved profile. It will further be noted that the support member 8 is also provided with means for fixing this member 8 in the tail light, which makes it possible to leave the edges of the glass substrate 3 free and thus give it a floating appearance. In addition, the support member 8 makes it possible to dissipate the heat emitted by the light sources 2 and transferred to this support member 8 via the through-holes 33. Finally, it is possible to add a thermal interface, between the face 81 for receiving the glass substrate 3 and the second face 32 of the glass substrate, for example formed from an organic material having particular thermal conductivity properties, in particular a thermal conductivity coefficient greater than 1 W/m/° C., filling the clearances and spaces between the face 81, the second face 32 and the various components that may be mounted on this second face 32.

FIG. 2 shows a second embodiment of a lighting module 10 according to the invention.

Unlike in the embodiment in FIG. 1, each light source 2 is mounted directly on the first interconnection layer 41. The plurality of light sources 2 thus forms a passive matrix screen. The lighting module 10 comprises a plurality of devices 52 for controlling the supply of electrical power to the light sources 2, each control device 52 being mounted on the second face 32 of the glass substrate 3 level with a through-hole 33 in order to control the supply of electrical power to the light source 2 mounted level with said through-hole 33.

In addition, the control unit 7 is incorporated into a ball grid array, which is mounted on the second interconnection layer 42 to control the passive matrix on the basis of the control instructions received by the connector 6.

It will be noted that in the example described, the receiving face 81 of the support member 8 is provided with a plurality of recesses 82 arranged to accommodate each of the control devices 52. The support member 8 thus also makes it possible to dissipate the heat emitted by these control devices 52. Finally, as in FIG. 1, it is possible to add a thermal interface between the face 81 and the second face 32 of the substrate 3.

FIG. 3 shows a third embodiment of a lighting module 100 according to the invention.

Unlike in the embodiment in FIG. 1, each light source 2 is mounted directly on the first interconnection layer 41. The lighting module 100 comprises integrated microcircuits 53, also mounted on this interconnection layer. In the variant shown, groups of light sources 2 are each connected, via the interconnection layer 41, to one of these integrated microcircuits 53, which thus controls these light sources 2. The light sources 2 and the integrated microcircuits 53 thus form an active matrix. The plurality of light sources 2 thus forms an active matrix screen selectively controlled, as in FIG. 1, by the control unit 7 on the basis of the control instructions received by the connector 6.

FIG. 4 shows a fourth embodiment of a lighting module 1000 according to the invention.

Unlike in the embodiment in FIG. 1, each light source 2 is mounted directly on the first interconnection layer 41. The interconnection layer 41 comprises a plurality of thin connection sub-layers incorporating a plurality of integrated microcircuits 54. Each light source 2 is each connected, via the interconnection layer 41, to one of these integrated microcircuits 54, which thus controls this or these light source(s) 2. The light sources 2 and the integrated microcircuits 54 of the thin connection sub-layers thus form an active matrix screen selectively controlled, as in FIG. 1, by the control unit 7 on the basis of the control instructions received by the connector 6.

The foregoing description clearly explains how the invention is able to achieve its stated objectives, in particular by proposing a lighting module comprising a plurality of light sources mounted on a glass substrate provided with interconnection through-holes. It will thus be appreciated that using a glass substrate makes it possible to reduce the substrate thickness until it is flexible and a convex curve can thus be applied thereto in order to obtain a screen with a uniform appearance that is visible in a wide field of view while following the curvature of the lighting device incorporating this lighting module. In addition, the use of through-holes means that the light sources that make up the screen can be addressed selectively without the need for specific connection arrangements on an edge of the substrate which would be visible, it being in particular possible for the connection arrangements to be positioned on a face of the substrate that is not visible. A screen with a floating appearance can thus be produced.

In any event, the invention is not limited to the embodiments specifically described in this document, and extends, in particular, to any equivalent means and to any technically operational combination of these means. In particular, a substrate made from a ceramic other than glass may be envisaged. Other types of light source than the one described may also be envisaged, and in particular light sources with larger dimensions, for example of between 80 µm and 300 µm. Other types of through-hole than the one described may also be envisaged, for example through-holes that are filled with a conductive material in order to interconnect the first and second interconnection layers. The application to the first face of the substrate of an opaque coating in a dark color and with a matt appearance may also be envisaged.

The invention claimed is:

1. A lighting module of a motor vehicle signaling device, comprising a convex ceramic substrate comprising opposing first and second faces, and a plurality of light sources that can be activated selectively, mounted on the first face of the ceramic substrate, each of the first and second faces of the ceramic substrate being provided with at least one first interconnection layer and at least one second interconnection layer, respectively, wherein the ceramic substrate comprises a plurality of through-holes arranged to interconnect the first interconnection layer and the second interconnection layer, the whole ceramic substrate has only one curvature, and the ceramic substrate has a thickness of between 100 µm and 200 µm and the curvature with a radius of curvature of between 90 mm and 500 mm.

2. The lighting module as claimed in claim 1, wherein the ceramic substrate is a glass substrate.

3. The lighting module as claimed in claim 2, wherein each light source is mounted on said first face of the ceramic substrate level with a through-hole.

4. The lighting module as claimed in claim 1, wherein each light source is mounted on said first face of the ceramic substrate level with a through-hole.

5. The lighting module as claimed in claim 1, the module comprising a connector capable of receiving an instruction for controlling said light sources and a control unit arranged to selectively control each of the light sources on the basis of said control instruction received by the connector.

6. The lighting module as claimed in claim 5, wherein the connector comprises an adhesive anisotropic conductive film, the connector being mechanically and electrically connected to one of the first and second interconnection layers by means of said adhesive anisotropic conductive film.

7. The lighting module as claimed in claim 6, wherein the connector comprises a flexible printed circuit board, the control unit being mounted on said flexible printed circuit board.

8. The lighting module as claimed in claim 6, wherein the connector is mounted on the second face of the ceramic substrate.

9. The lighting module as claimed in claim 6, further comprising a plurality of active control elements, each active control element being arranged to control one of the light sources with which it is associated and being mounted on a first interconnection layer level with one of the through-holes so as to be connected to the second interconnection layer, said plurality of active control elements forming an active matrix and the control unit being arranged to control said active matrix on the basis of said control instruction received by the connector.

10. The lighting module as claimed in claim 5, wherein the connector is mounted on the second face of the ceramic substrate.

11. The lighting module as claimed in claim 5, further comprising a plurality of active control elements, each active control element being arranged to control one of the light sources with which it is associated and being mounted on a first interconnection layer level with one of the through-holes so as to be connected to the second interconnection layer, said plurality of active control elements forming an active matrix and the control unit being arranged to control said active matrix on the basis of said control instruction received by the connector.

12. The lighting module as claimed in claim 5, wherein each light source is mounted directly on the first interconnection layer, the plurality of light sources forming a passive matrix and the control unit being arranged to control said passive matrix on the basis of the control instruction received by the connector.

13. The lighting module as claimed in claim 12, further comprising a support member on which the ceramic substrate is mounted.

14. The lighting module as claimed in claim 1, further comprising an opaque coating applied to the first face of the ceramic substrate.

15. A lighting module of a motor vehicle signaling device, comprising:
- a ceramic substrate having opposing first and second faces, each of the first and second faces of the ceramic substrate being provided with at least one first interconnection layer and at least one second interconnection layer, respectively, wherein the ceramic substrate comprises a plurality of through-holes arranged to interconnect the first interconnection layer and the second interconnection layer;
- a plurality of light sources mounted on the first face of the ceramic substrate, the light sources configured to be activated selectively;
- a connector configured to receive an instruction for controlling the light sources;
- a plurality of control devices arranged to selectively control the light sources on the basis of the instruction received by the connector; and
- a support member on which the ceramic substrate is mounted,
- wherein the support member is provided with a plurality of recesses arranged to accommodate the control devices, or
- the support member is fixed to the ceramic substrate such that edges of the ceramic substrate are left free.

16. The lighting module of claim 15, wherein the support member is provided with a plurality of at least one recess arranged to accommodate the at least one control unit.

17. The lighting module of claim 15, wherein the support member is fixed to the ceramic substrate such that edges of the ceramic substrate are left free.

18. The lighting module of claim 15, further comprising a thermal interface formed between the support member and the ceramic substrate.

19. A lighting module of a motor vehicle signaling device, comprising:
- a ceramic substrate having opposing first and second faces, each of the first and second faces of the ceramic substrate being provided with at least one first interconnection layer and at least one second interconnection layer, respectively, wherein the ceramic substrate comprises a plurality of through-holes arranged to interconnect the first interconnection layer and the second interconnection layer; and
- a plurality of light sources mounted on the first face of the ceramic substrate, the light sources configured to be activated selectively,
- wherein each of the light source is mounted directly on the first interconnection layer, and
- the first interconnection layer comprises a plurality of connection sub-layers incorporating a plurality of integrated microcircuits, each of the light sources being connected, via the first interconnection layer, to one of the integrated microcircuits.

\* \* \* \* \*